United States Patent [19]

Takahashi

[11] Patent Number: 5,171,707
[45] Date of Patent: Dec. 15, 1992

[54] METHOD OF FABRICATING SEMICONDUCTOR LASER DEVICE USING THE LIGHT GENERATED BY THE LASER TO DISORDER ITS ACTIVE LAYER AT THE END SURFACES THEREBY FORMING WINDOW REGIONS

[75] Inventor: Kazuhisa Takahashi, Itami, Japan

[73] Assignee: Mitsubishi Denki Kabushiki Kaisha, Japan

[21] Appl. No.: 744,446

[22] Filed: Aug. 13, 1991

[30] Foreign Application Priority Data

Sep. 13, 1990 [JP] Japan ................. 2-245017

[51] Int. Cl.$^5$ ................... H01L 21/20; H01L 21/306; H01R 21/22
[52] U.S. Cl. ....................... 437/129; 437/145; 437/170; 437/171; 148/DIG. 95; 148/DIG. 160
[58] Field of Search ............. 437/129, 126, 145, 170, 437/171; 148/DIG. 95, DIG. 160

[56] References Cited

U.S. PATENT DOCUMENTS 4,980,313 12/1990 Takahashi ..................... 437/129

FOREIGN PATENT DOCUMENTS 0373933 6/1990
60-101989 6/1985 Japan .
1-72582 3/1989 Japan .
2-159082 6/1990 Japan .
3-32084 2/1991 Japan .

OTHER PUBLICATIONS

Epler et al, "Layer Disordering of GaAs-AlGaAs Superlattices By Diffusion of Laser-Incorporated Si", Journal of Applied Physics, vol. 64, No. 7, Oct. 1988, pp. 3439-3444.
Suzuki et al, "Fabrication Of GaAlAs Window Stripe Multi-Quantum Well Heterostructure Lasers Utilizing Zn Diffusion-Induced Alloying", Electronics Letters, vol. 20, No. 9, Apr. 1984, pp. 383-384.

*Primary Examiner*—Brian E. Hearn
*Assistant Examiner*—Linda Fleck
*Attorney, Agent, or Firm*—Leydig, Voit & Mayer

[57] ABSTRACT

A method of fabricating a semiconductor laser device includes disposing a lower cladding layer, a superlattice active layer, an upper cladding layer, and a contact layer in the named order on a substrate, forming resonator end surfaces, disposing, on the resonator end surfaces, films containing a material that disorders the semiconductor superlattice structure when diffused into the superlattice structure, and passing a current between the substrate and the contact layer to cause laser oscillations. The laser oscillations produce laser light that is absorbed at the resonator end surfaces. The resonator end surfaces are locally heated due to absorption of laser light whereby the disorder-causing material is diffused from the films into the resonator end surfaces and the semiconductor superlattice structure in the vicinity of the resonator end surfaces is thereby disordered to form window regions.

7 Claims, 3 Drawing Sheets

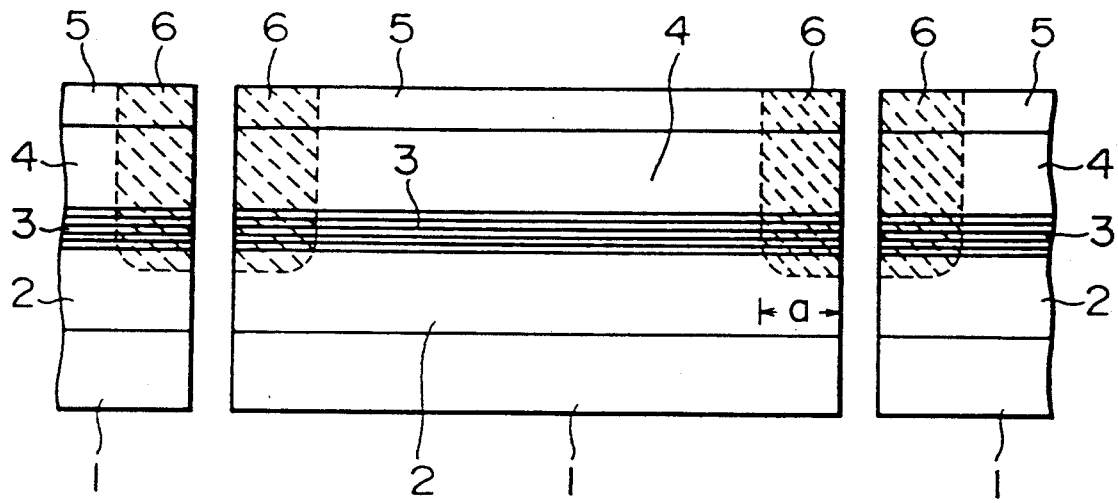
FIGURE 3
PRIOR ART
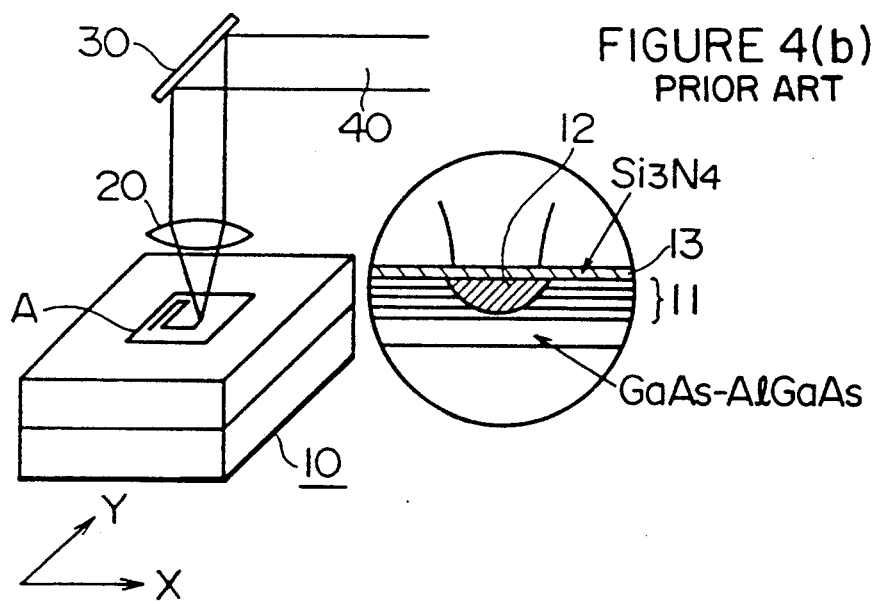
FIGURE 4(b)
PRIOR ART
FIGURE 4(a)
PRIOR ART

METHOD OF FABRICATING SEMICONDUCTOR LASER DEVICE USING THE LIGHT GENERATED BY THE LASER TO DISORDER ITS ACTIVE LAYER AT THE END SURFACES THEREBY FORMING WINDOW REGIONS

This invention relates to a so-called "window structure" semiconductor laser device operable to provide high output power, and more particularly to a method of making a semiconductor laser device including an active layer having a superlattice structure, and including a window structure having window regions formed in a self-aligning manner.

BACKGROUND OF THE INVENTION

FIG. 1 shows a cross-section of a conventional semiconductor laser device having a so-called window structure, which can operate to provide high output power. This semiconductor laser device has an active layer of a superlattice structure. In FIG. 1, successively disposed on an N-type GaAs substrate 1 are an N-type AlGaAs lower cladding layer 2, a GaAs/AlGaAs superlattice-structure active layer 3, a P-type AlGaAs upper cladding layer 4, and a P-type GaAs contact layer 5, with the N-type AlGaAs lower cladding layer being disposed on the substrate 1. Zn is diffused into the thus formed structure from the surface at opposite ends of the contact layer 5 to form Zn diffusion regions 6. The Zn diffusion disorders opposite end portions of the superlattice structure of the active layer 3 to thereby form disordered regions 7, 7'. The disordered regions 7 and 7' provide laser resonator end surfaces 8 and 8'.

The semiconductor laser device of FIG. 1 may be fabricated by a process such as one shown in FIGS. 2 and 3. As shown in FIG. 2, the N-type AlGaAs lower cladding layer 2, the GaAs/AlGaAs superlattice active layer 3, the P-type AlGaAs upper cladding layer 4, and the P-type GaAs contact layer 5 are sequentially grown in the named order on the N-type GaAs substrate 1. Next, a film of, for example, $Si_3N_4$ is deposited over the P-type GaAs contact layer 5, and photolithographic techniques are used to form a mask 9 with a desired pattern from the $Si_3N_4$ film.

Then, Zn is diffused into the structure through the openings in the mask 9 to form disordered regions 60. Then, the mask 9 is removed, and the structure is cleaved in the thickness direction at the center of each disordered region 60. Thus, semiconductor laser devices such as the one shown in FIG. 1 result.

FIGS. 4(a) and 4(b) illustrate another method of selectively disordering a GaAs/AlGaAs superlattice structure, which is shown in J. Appl. Phys. 64(7), Oct. 1, 1988, pages 3439–3444. FIG. 4(b) is an enlarged cross-sectional view of a portion of an area A shown in FIG. 4(a). A semiconductor laser chip 10 having a superlattice structure therein is placed on a computer-controlled X-Y table (not shown). The semiconductor laser chip 10 has an $Si_3N_4$ coating 13 on its surface. An Ar laser beam 40 is directed via a mirror 30 and a condenser lens 20 to a predetermined location on the surface of the semiconductor laser chip 10 with the $Si_3N_4$ coating 13 thereon. Ar laser beam energy is absorbed by that portion of the semiconductor laser chip 10 where the Ar laser beam impinges, so that that portion is locally heated to a high temperature, which causes Si in the $Si_3N_4$ coating 13 to be diffused into a superlattice layer 11. This, in turn, promotes interdiffusion of GaAs and AlGaAs which constitute the superlattice layer 11, whereby a disordered region 12 is formed. By moving the X-Y table on which the semiconductor laser chip 10 is mounted, a disordered region can be formed in any desired pattern. By cleaving the semiconductor laser chip 10 in its thickness direction at the center of the disordered region 12 shown in FIG. 4(b), a semiconductor laser device similar to the one shown in FIG. 1 is provided.

The semiconductor laser device shown in FIG. 1 is a typical example of semiconductor laser devices which may be fabricated by the techniques shown in FIGS. 2 and 3 and FIGS. 4(a) and 4(b). In FIG. 1, the P-type GaAs contact layer 5 and the N-type GaAs substrate 1 are connected across an operating power supply to cause current to flow therebetween. This causes light to be generated in the active layer 3, and oscillations occur in a waveguide formed by the active layer 3 and the two opposing end surfaces 8 and 8', which operates as a resonator. In the regions 7 and 7' where the GaAs/AlGaAs superlattice structure of the active layer 3 is disordered due to the Zn diffusion, the bandgap is greater than that of GaAs, so that laser light generated in the active layer 3 is emitted without being absorbed. Accordingly, the heat generated in the disordered regions 7 and 7' is significantly reduced, and, therefore, the laser device can be operated to provide high output power.

In the conventional method shown in FIGS. 2 and 3, Zn is diffused from the surface of the P-type GaAs contact layer 5 in the thickness direction to reach the N-type AlGaAs lower cladding layer 2. According to this conventional method, because Zn has to be diffused relatively deeply thermal treatment for a long time is required. Such a long thermal treatment may also disorder superlattice structure portions into which no Zn has been diffused. Furthermore, the width a of the disordered regions 7, 7' (see FIGS. 1 and 3) cannot be made smaller than about one-half the depth of diffusion. A larger width of the disordered regions adversely affects various laser characteristics. For example, it may increase laser beam astigmatism. In addition, in order to fabricate discrete laser devices from the semiconductor laser chip after the Zn diffusion, it is necessary to cleave the chip at the center of the disordered regions 60, 60 (FIG. 2). If the cleavage at the center of the disordered regions fails, a desired window structure cannot be obtained, and, therefore, this method provides a low yield.

In the method shown in FIG. 4, it is necessary to precisely position the region to be disordered relative to the Ar laser beam by means of the X-Y table. However, the positional adjustment is difficult, and sufficient precision is hardly attained. Furthermore, it is difficult to establish a precise distance between the condenser lens 20 and the semiconductor chip 10.

An object of the present invention is to provide a method of fabricating a semiconductor laser device free of the above-stated drawbacks of the conventional methods. According to the present invention, portions of an active layer having a semiconductor superlattice structure are disordered in a self-aligning manner.

SUMMARY OF THE INVENTION

According to the method of fabricating a semiconductor laser device of the present invention, a thin film containing a material which causes a semiconductor superlattice structure to be disordered at a high temperature is disposed on resonator end surfaces of the semiconductor laser device, and current of an appropriate magnitude is caused to flow in the laser device to produce laser oscillation. Light generated by the laser oscillation is absorbed by regions of the resonator end surfaces which are to be disordered, so that the regions are locally heated. The thus generated heat is used to disorder the structure at the resonator end surfaces.

BRIEF DESCRIPTION OF THE DRAWINGS

FIGS. 2 and 3 are cross-sectional views at different manufacturing steps for use in explaining disordering of a superlattice structure to manufacture the semiconductor laser device of FIG. 1;

FIG. 4(a) illustrates another conventional method of disordering a superlattice structure;

FIG. 4(b) is an enlarged cross-sectional view of a portion of the device of FIG. 4(a);

DETAILED DESCRIPTION OF PREFERRED EMBODIMENT

Figure 1:
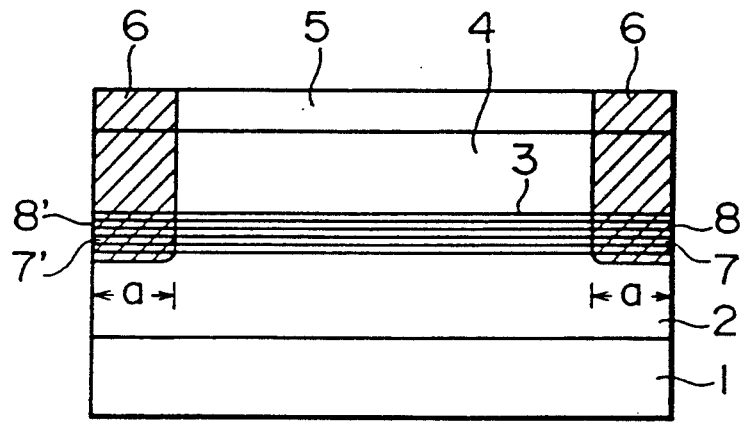
FIG. 1 is a cross-sectional view of a conventional window-structure type semiconductor laser device.
Figure 2:
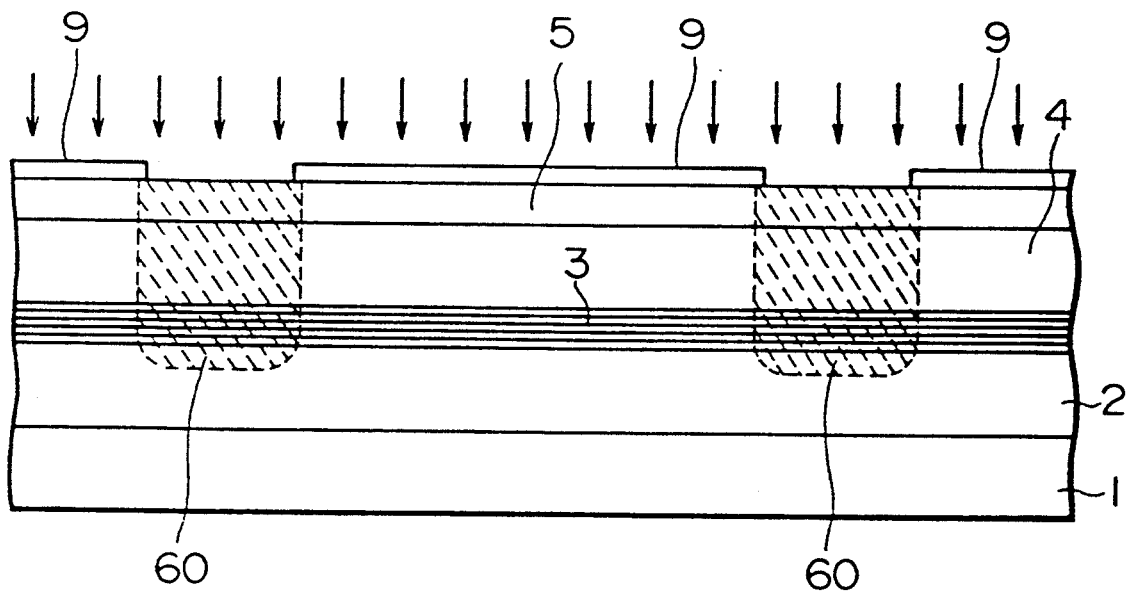
Figure 5:
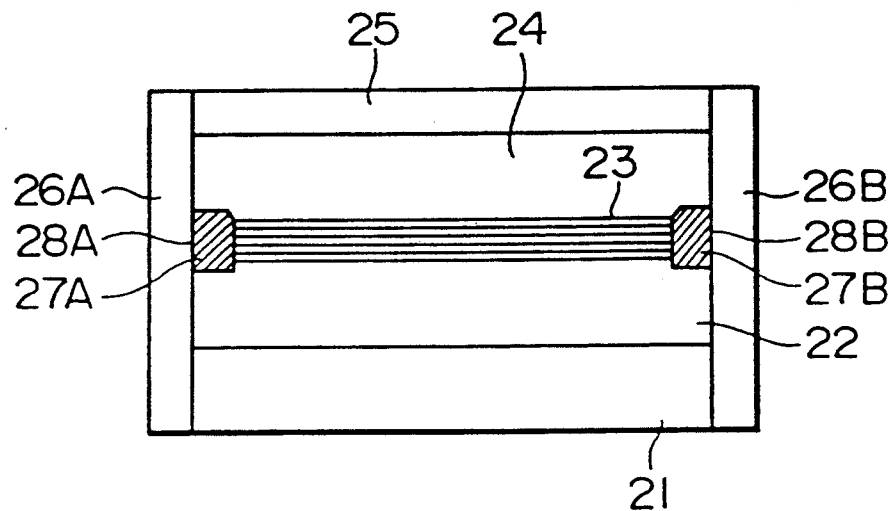
FIG. 5 is a cross-sectional view of a major portion of a semiconductor laser device having a window structure according to the present invention.

Referring now to FIG. 5 which shows a semiconductor laser device manufactured in accordance with the present invention, an N-type AlGaAs lower cladding layer 22, an active layer 23 having a GaAs/AlGaAs superlattice structure, a P-type AlGaAs upper cladding layer 24, and a P-type GaAs contact layer 25 are formed in the named order on an N-type GaAs substrate 21, with the layer 22 being adjacent to the substrate 21. On opposite end surfaces of the semiconductor laser device, ZnO films 26A and 26B are disposed. Respective disordered regions 27A and 27B have been formed through the diffusion of Zn in the ZnO films 26A and 26B into the end portions of the superlattice structure active layer 23. The outer ends of the disordered regions 27A and 27B provide respective resonator end surfaces 28A and 28B of a laser oscillator section.

Figure 6:
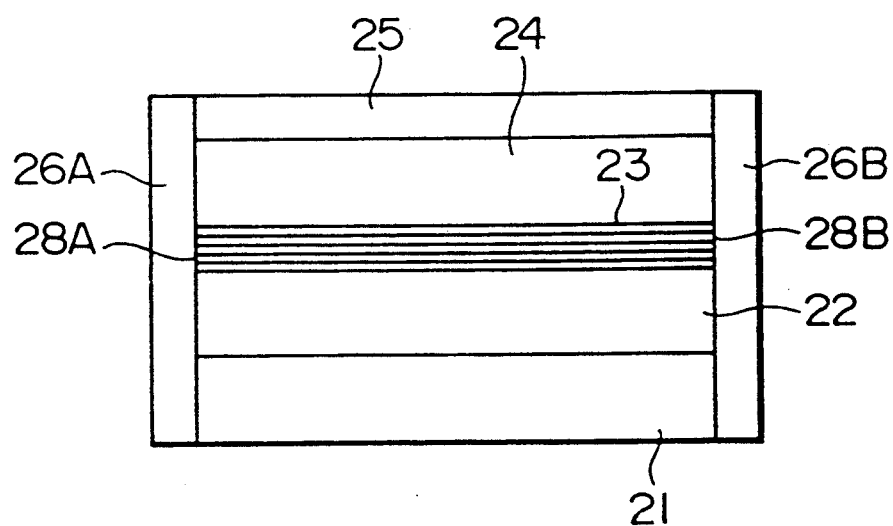
FIG. 6 is a cross-sectional view of the semiconductor laser device shown in FIG. 5 in one manufacturing step of the method according to the present invention.

The semiconductor laser device of FIG. 5 is fabricated in the following manner. First, on an N-type GaAs substrate, an N-type AlGaAs lower cladding layer, a GaAs/AlGaAs superlattice active layer, a P-type AlGaAs upper cladding layer, are grown in and a P-type GaAs contact layer, in the named order. The wafer is then cleaved in a conventional manner into a structure of predetermined size, which includes the N-type AlGaAs lower cladding layer 22, the GaAs/AlGaAs superlattice active layer 23, the P-type AlGaAs upper cladding layer 24, and the P-type GaAs contact layer 25 disposed in the named order on the N-type GaAs substrate 21. Then, by a conventional sputtering technique, using ZnO as a target, the ZnO films 26A and 26B are disposed on opposite end surfaces of the structure, as shown in FIG. 6. Then, current of appropriate magnitude is caused to flow between the P-type GaAs contact layer 25 and the N-type GaAs substrate 21, which results in laser oscillations in the GaAs/AlGaAs superlattice structure active layer 23. In regions in the vicinity of the resonator end surfaces 28A and 28B, due to surface recombination, the current flowing in these regions does not contribute to generation of light, and, furthermore, these regions absorb laser light generated in the active layer 23, so that heat is generated in these regions. This causes these regions near the resonator end surfaces 28A and 28B to be locally heated to a high temperature, which, in turn, causes Zn to be diffused from the ZnO films 26A and 26B on the end surfaces 28A and 28B into the active layer 23. Due to the diffusion of Zn, the GaAs/AlGaAs superlattice structure in the end portions of the active layer 23 is locally disordered. The disordering of the GaAs/AlGaAs superlattice structure changes the regions into AlGaAs regions, which are transparent to and, therefore, do not absorb laser light generated in the active layer. Thus, the transparent regions provide a so-called "window" structure. The width of the regions which generate heat by absorbing light generated in the portions of the active layer 23 in the vicinity of the resonator end surfaces 28A and 28B during the process of disordering is only 1 μm at most. Accordingly, the width of the regions which are made transparent to laser light as a result of the disordering and provide window regions can be at most 1 μm or so. When current is caused to flow between the P-type GaAs contact layer 25 and the N-type GaAs substrate 21 of the structure shown in FIG. 6, heat is generated at the resonator end surfaces 28A and 28B, but, before a temperature (e.g. about 1000° C.) at which crystals would melt is reached, Zn is diffused from ZnO, whereby the structure of FIG. 6 changes into the structure shown in FIG. 5. After that, laser light is no more absorbed and, therefore, no more heat is generated. Thus, the crystals do not melt.

In the above-described embodiment, GaAs and AlGaAs are used as materials for the semiconductor laser device, but the present invention can be used for fabricating devices formed of InP/InGaAs, InP/InGaAsP, GaAs/AlGaInP, InP/AlGaInAs, or any other suitable materials. Further, in place films of ZnO, films of CdO, MgO, or BeO or films containing an element acting as a P-type dopant can be used.

To sum up, according to the present invention, films are disposed on opposite end surfaces of a semiconductor laser resonator, which films contain a material that induces disorder of a semiconductor superlattice structure, and current is caused to flow to cause laser oscillations to occur. The laser oscillations cause heat to be generated locally at the resonator end surfaces. The heat then causes the disorder-inducing material in the films to be diffused into the structure, whereby the semiconductor superlattice structure in the vicinity of the resonator end surfaces is disordered locally in a self-aligning manner. According to this method, the semiconductor superlattice structure of the active layer in the portions other than those in the vicinity of the resonator end surfaces is not disordered at all. Accordingly, it is possible to fabricate a semiconductor laser device which can generate laser light at a precise wavelength as determined by the composition of the grown crystals. Furthermore, according to the present invention, the width of the window regions can be as small as 1 μm or so at the most, so that superior semiconductor laser devices with small astigmatism can be obtained.

What is claimed is:

1. A method of fabricating a semiconductor laser device comprising the steps of:
    forming a structure comprising a lower cladding layer, an active layer including a semiconductor superlattice structure, an upper cladding layer, and a contact layer on a substrate in the named order with said lower cladding layer being adjacent to the substrate;

cleaving the structure to form opposed resonator end surfaces transverse to the layers;

disposing, on said resonator end surfaces, films containing a material that, upon diffusion into said superlattice structure, disorders said semiconductor superlattice structure; and passing a current of predetermined magnitude between said substrate and said contact layer and thereby generating laser light that is absorbed at and geneates heat at said resonator end surfaces, causing said material to diffuse from said films into the superlattice structure adjacent said resonator end surfaces, whereby said semiconductor superlattice structure adjacent said resonator end surfaces is disordered to form window regions.

2. The method of fabricating a semiconductor laser device according to claim 1 wherein said substrate if N-type GaAs, said lower cladding layer is N-type AlGaAs, said active layer is a GaAs/AlGaAs superlattice structure, said upper cladding layer is P-type AlGaAs, and said contact layer is P-type GaAs, including disposing on said resonator end surfaces films selected from the group consisting of ZnO, CdO, MgO, BeO, and any other suitable material which contains an element acting as a P-type dopant in GaAs and AlGaAs.

3. The method of fabricating a semiconductor laser device according to claim 1 wherein said substrate if N-type InP, said lower cladding layer is N-type InGaAs, said active layer is an InP/InGaAs superlattice structure, said upper cladding layer is P-type InGaAs, and said contact layer is P-type InP, including disposing on said resonator end surfaces films selected from the group consisting of ZnO, CdO, MgO, BeO, and any other suitable material which contains an element acting as a P-type dopant in InP and InGaAs.

4. The method of fabricating a semiconductor laser device according to claim 1 wherein said substrate if N-type InP, said lower cladding layer is N-type InGaAsP, said active layer is an InP/InGaAsP superlattice structure, said upper cladding layer is P-type InGaAsP, and said contact layer is P-type InP, including disposing on said resonator end surfaces films selected from the group consisting of ZnO, CdO, MgO, BeO, and any other suitable material which contains an element acting as a P-type dopant in InP and InGaAsP.

5. The method of fabricating a semiconductor laser device according to claim 1 wherein said substrate if N-type GaAs, said lower cladding layer is N-type AlGaInP, said active layer is a GaAs/AlGaInP superlattice structure, said upper cladding layer is P-type AlGaInP, and said contact layer is P-type GaAs, including disposing on said resonator end surfaces films selected from the group consisting of ZnO, CdO, MgO, BeO, and any other suitable material which contains an element acting as a P-type dopant in GaAs and AlGaInP.

6. The method of fabricating a semiconductor laser device according to claim 1 wherein said substrate if N-type InP, said lower cladding layer is N-type AlGaInAs, said active layer is an InP/AlGaInAs superlattice structure, said upper cladding layer is P-type AlGaInAs, and said contact layer is P-type InP, including disposing on said resonator end surfaces films selected from the group consisting of ZnO, CdO, MgO, BeO, and any other suitable material which contains an element acting as a P-type dopant in InP and AlGaInAs.

7. The method of fabricating a semiconductor laser device according to claim 1 including forming window regions at the resonator end surfaces of a width not exceeding 1 $\mu$m by disordering the semiconductor superlattice structure.

* * * * *